United States Patent
Ong et al.

(10) Patent No.: US 6,752,896 B2
(45) Date of Patent: Jun. 22, 2004

(54) METHOD OF DETACHING A FILM OF MATERIAL FROM A SUBSTRATE

(75) Inventors: See Yap Ong, Singapore (SG); Keng Hock Chew, Singapore (SG); Shu Chuen Ho, Singapore (SG); Teng Hock Kuah, Singapore (SG)

(73) Assignee: ASM Technology Singapore PTE LTD (SG)

( * ) Notice: Subject to any disclaimer, the term of this patent is extended or adjusted under 35 U.S.C. 154(b) by 77 days.

(21) Appl. No.: 09/901,142

(22) Filed: Jul. 10, 2001

(65) Prior Publication Data

US 2003/0010430 A1 Jan. 16, 2003

(51) Int. Cl.[7] .............................................. B32B 00/00
(52) U.S. Cl. ..................... 156/344; 156/427; 156/429; 156/241; 156/584; 156/239; 29/426.5; 29/762; 29/806; 29/239; 29/426.1; 29/426.3; 29/DIG. 1

(58) Field of Search ................................. 156/241, 427, 156/429, 344, 584, 239; 29/426.5, 762, 806, 239, 426.1, 426.3, DIG. 1

(56) References Cited

U.S. PATENT DOCUMENTS

| | | | | |
|---|---|---|---|---|
| 4,631,103 A | * | 12/1986 | Ametani | ...................... 156/241 |
| 4,770,737 A | * | 9/1988 | Seki | ........................... 156/584 |
| 5,006,190 A | * | 4/1991 | Earle | ........................... 156/247 |

* cited by examiner

Primary Examiner—David A. Zarneke
(74) Attorney, Agent, or Firm—Morrison & Foerster LLP

(57) ABSTRACT

A method of detaching a film of material (2) from the surface (5) of a substrate (1). An outlet (11) of a fluid delivery device (10) is engaged with an aperture (7, 8) in the substrate (1) from the opposite side of the substrate (1) from the surface (5) to which the film (2) is attached. Fluid is passed out of the outlet (11) and through the aperture (7, 8) to generate a detaching force between the film of material (2) and the surface (5) adjacent to the aperture (7, 8).

7 Claims, 3 Drawing Sheets

STEP 1: BEFORE AIR-PUNCH DOWN

STEP 2: AIR-PUNCH DOWN TO LOCATE IN POSITION

STEP 3: AIR BLOW ACTIVATED MASKING TAPE SEPARATED FROM LEADFRAME

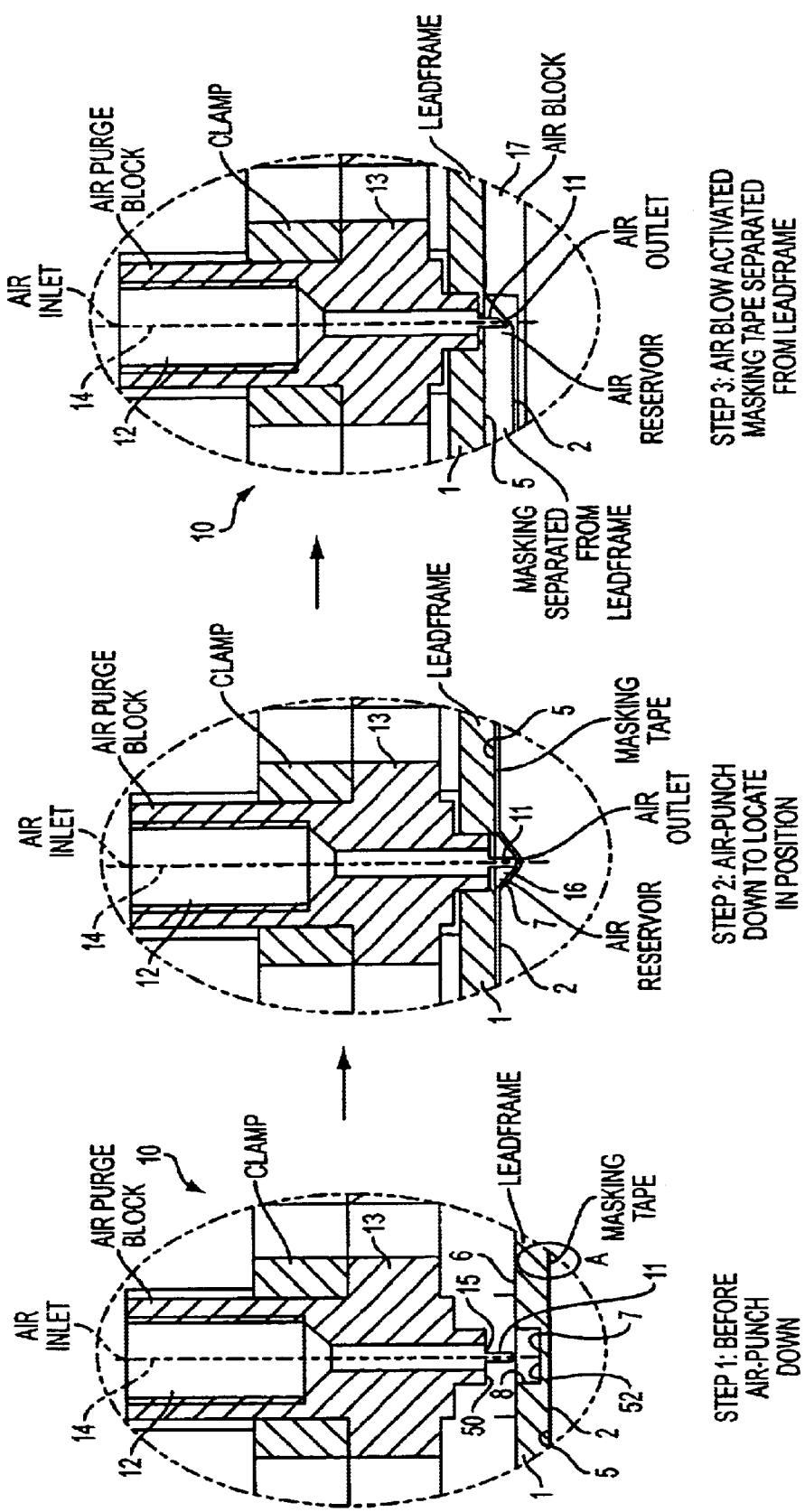

STEP 1: AIR-PURGE DOWN AND FINGER WEDGE INSERTED INTO MASKING TAPE

STEP 2: FINGER WEDGE MOVES UP AND GRIP ONTO THE MASKING TAPE

STEP 3: FINGER WEDGE SHEAR DOWN AT SHEARING ANGLE TO REMOVE MASKING TAPE FROM THE LEADFRAME

METHOD OF DETACHING A FILM OF MATERIAL FROM A SUBSTRATE

FIELD OF THE INVENTION

The invention relates to a method of detaching a film of material from a substrate.

BACKGROUND OF THE INVENTION

Recently, semiconductor device packaging techniques have been developed in which a semiconductor chip is mounted on a substrate and an epoxy resin material is molded around the semiconductor chip on only one side of the substrate. Hence, the underside of the substrate is left substantially free of the epoxy resin material. One particular type of packaged device where this technique is used is commonly known as a quad, flat, no lead (QFN) package where the substrate is a metal lead frame. In order to prevent epoxy resin material seeping onto the underside of the lead frame and causing flashing, it is conventional practice to attach an adhesive masking tape to the underside of the lead frame. The lead frame with semiconductor chip and masking tape is then placed into a mold and epoxy resin material is molded around the semiconductor chip. The masking tape minimises seepage of epoxy resin molding material onto the underside of the lead frame, and so helps reduce flashing.

However, one of the problems with using masking tape to minimise flashing on the underside of the lead frame is the subsequent processing of the lead frame to detach the adhesive masking tape from the lead frame without damaging the lead frame or the packaged device.

SUMMARY OF THE INVENTION

In accordance with a first aspect of the present invention, there is provided a method of detaching a film of material from the surface of a substrate, the method comprising engaging a fluid delivery device with an aperture in the substrate from the opposite side of the substrate from which the film is attached to the substrate, and causing the fluid delivery device to pass a fluid through the aperture to generate a detaching force between the film of material and the surface of a substrate adjacent to the aperture.

Preferably, the method further comprises inserting the fluid delivery device through the aperture from the opposite side of the substrate to which the film is attached, and pressing the fluid delivery device against the film to separate the film from the surface of the substrate adjacent to the aperture prior to passing the fluid through the aperture.

In accordance with a second aspect of the present invention, there is provided a method of detaching a film of material from a surface of the substrate, the method comprising attaching a detachment member to the external surface of the film opposite to the surface of a substrate such that the attachment force between the detaching member and the film is greater than the adhesion force between the film and the surface of a substrate, and moving the detachment member away from the surface of the substrate to cause the film to detach from the substrate.

Preferably, the first aspect of the invention may be used in combination with the second aspect of the invention to remove the film from the substrate.

Typically, the first aspect of the invention is used to initiate detachment of the film from the substrate and the second aspect of the invention is used to remove the film from the substrate.

In one example of the invention, the detaching member may comprise a second film of material which is attached to the exposed side of the first film, typically by an adhesive. Typically, where the first aspect is used in combination with the second aspect, the second film is attached to the first film before the fluid is passed through the aperture in the substrate by the fluid delivery device.

Preferably, the second film comprises a layer of adhesive.

In a further example of the invention, the detaching member comprises a clamp device adapted to clamp onto an edge portion of the first film Preferably, the aperture in the substrate is adjacent the edge portion of the first film which is engaged by the clamp device.

Preferably, the clamp member comprises a wedge shaped member which is adapted to be inserted between the first film and the substrate and a clamp member movable relative to the wedge shaped member to cause the film to be clamped between the wedge shaped member and the clamp member when the clamp member moves to a clamping position.

BRIEF DESCRIPTION OF THE DRAWINGS

Examples of a method for detaching a film of material from a substrate in accordance with the invention will now be described with reference to the accompanying drawings, in which:

FIGS. 1A to 1C are cross-sectional schematic views of an air purge mechanism showing initiating detachment of a masking tape from a lead frame;

DESCRIPTION OF PREFERRED EMBODIMENTS

Figure 2A:
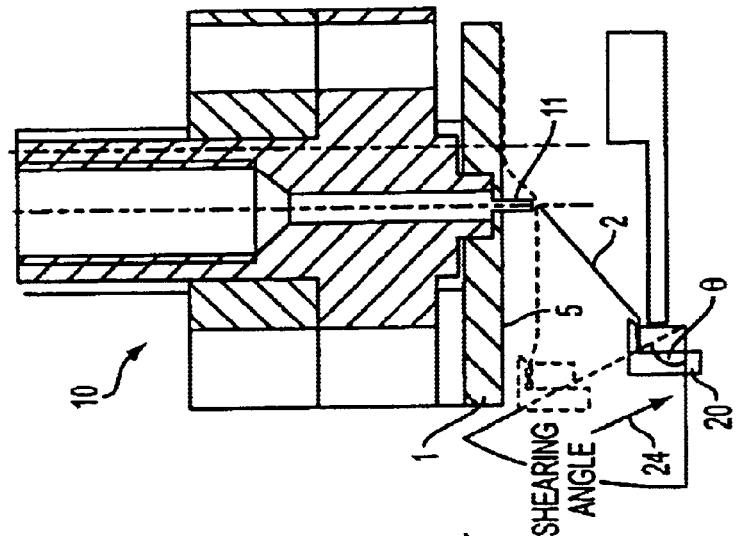
FIGS. 2A to 2C are schematic cross-sectional views showing removal of the masking tape from the substrate following initiation of the detachment using a clamp mechanism.

FIGS. 1A to 1C show a lead frame 1 with a polyimide adhesive tape 2 attached to a surface 5 of the lead frame 1. In this example, the lead frame 1 is a lead frame for a QFN semiconductor device package and a semiconductor chip (not shown) would be mounted on surface 6 of the lead frame 1 on a die attach portion (not shown) of the surface 6. The masking tape 2 is attached to the surface 5 of the lead frame 1 so that during molding of epoxy resin material around a chip mounted on the surface 6, seepage of epoxy resin material onto the surface 5 (commonly known as flashing) is minimised.

However, after molding, it is necessary to remove the masking tape 2 from the surface 5 of the lead frame 1. Therefore, after the molded lead frame is removed from the mold, it passes to a position in an air purge mechanism 10 as shown in FIG. 1A. The air purge mechanism 10 includes a hollow probe 11 and a passage within the probe 11 communicates with an air inlet chamber 12 located in an air purge block 13. The air purge mechanism 10 is movable relative to the lead frame 1 along an axis 14 so that the probe 11 can be inserted into an aperture 7 formed in a recess 8 in surface 6 of the lead frame 1. Surface 50 of the air purge block 13 is configured to be parallel to surface 52 of the recess 8. The aperture 7 is a through aperture between the recess 8 and surface 5 of the lead frame.

Hence, when the probe 11 is inserted into the aperture 7 through the recess 8, the end of the probe 11 hits the surface of the masking tape 2 which is adhered to the surface 5 and further movement of the probe 11 into the hole 7 (see FIG. 1B) causes detachment of the film 2 from the lead frame 1 in the region adjacent to the hole 7 to form a cavity 16. At the same time a seal 15 on the probe 11 seals between the probe 11 and the hole 7. The air inlet 14 is connected to a pressurised air source (not shown) which is then actuated to cause air to flow through the probe 11 into the cavity 16 formed by the probe 11 pushing against the tape 2. The change in volumetric flow rate and pressure within the cavity 16, caused by air from the inlet 14 entering the cavity 16 through the probe 11, causes separation of the masking tape 2 from the surface 5, as shown in FIG. 1C.

During the air purge operation, a support member 17 is moved into engagement with the tape 2 so that the tape 2 is supported on one side the probe 11, as shown in FIG. 1C. This ensures that the masking tape 2 separates from the surface 5 on the left hand side of the probe 11, as shown in FIG. 1C, as air is prevented from separating the masking tape 2 from the lead frame 1 on the right hand side by the support member 17. This ensures that if the recess 8 and hole 7 are located adjacent to an edge 3 (see FIG. 2A) of the lead frame 1, the tape 2 separates from the lead frame 1 at the edge 3 to enable a clamping mechanism 20 to engage with the edge of the masking tape 2 to enable the clamping mechanism 20 to remove the masking tape 2 from the lead frame 1.

Figure 2B:
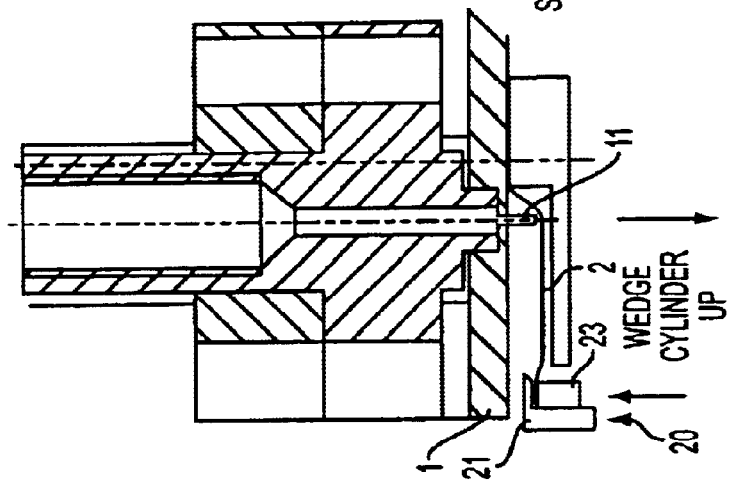
Figure 2C:
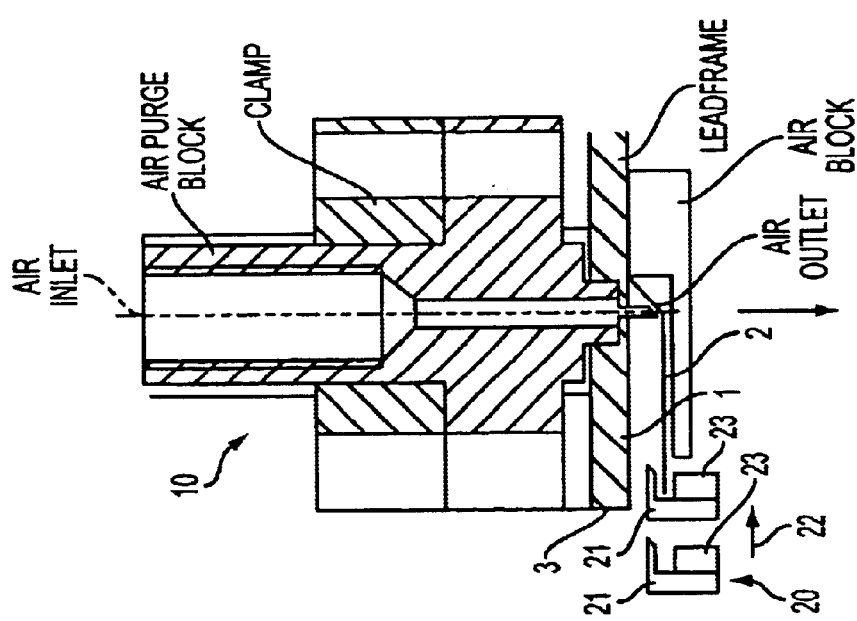

After separation of the tape 2 from the lead frame 1, as shown in FIG. 1C, the tape 2 may be removed from the lead frame 1 using a clamp mechanism 20 which comprises a wedge shaped member 21 and a gripping member 22 (see FIG. 2A). The clamp mechanism 20 is moved in the direction of arrow 23 so that the wedge shaped member 21 is inserted between the tape 2 and the substrate 1. The gripping member 23 is on the opposite side of the tape 2 from the wedge shaped member 21, as shown in FIG. 2A. As shown in FIG. 2B, the gripping member 23 is then moved upwards, with respect to the wedge shaped member 21, to clamp the end of tape 2 between the gripping member 23 and the wedge shaped member 21. The clamp mechanism 20 is then moved away from the lead frame 1 in the direction of arrow 24 at a shearing angle θ to the position shown in FIG. 2C. Further movement of the clamp mechanism 20 parallel to the lead frame 1 causes the tape 2 to be sheared away from surface 5 of the lead frame 1 to remove the masking tape 2 from the surface 5.

It should be noted that use of the air purge mechanism 10 is not essential to permit removal of the masking tape 2 using the clamp mechanism 20, as it is possible that the edge 3 of the lead frame 1 could be configured to enable the clamping mechanism 20 to engage with the end of the tape 2 without requiring an edge portion of the masking tape 2 to be first separated from the lead frame 1.

In addition, the use of the clamp mechanism 20 following use of the air purge mechanism 10 is not essential. After use of the air purge mechanism 10 to cause separation of a portion of the masking tape 2 from the lead frame 1, removal of the masking tape 1 from the lead frame could be performed using any other suitable means. For example, the masking tape 2 could be removed using an adhesive tape 32 which is adhered to the exposed side of the masking tape 2 (i.e. the side of the masking tape 2 not attached to the lead frame 1), as shown in FIGS. 3A and 3B.

Figures 3A, 3B:
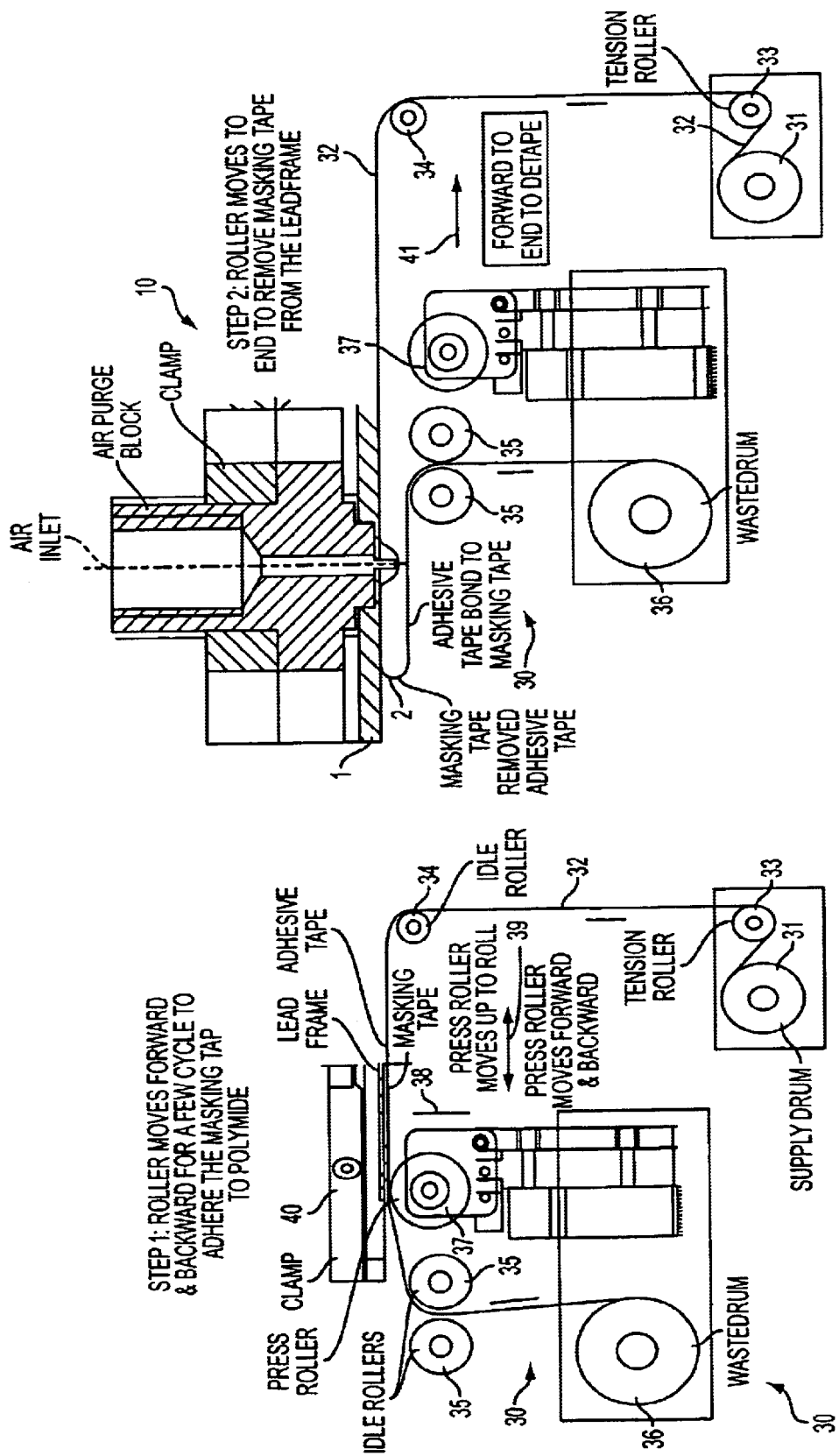
FIGS. 3A and 3B show removal of the masking tape from the substrate using an adhesive tape.

FIGS. 3A and 3B show an adhesive masking tape removal mechanism 30 which includes a supply drum 31 on which is mounted a roll of adhesive tape 32. The adhesive tape 32 extends around the tension roller 33, an idling roller 34, through a pair of guide rollers 35 to a waste drum 36. The adhesive tape removal mechanism 30 also includes a press roller 37 which can be moved vertically in the direction of the arrow 38 with respect to the idle roller 34 and the guide rollers 35 and horizontally in the direction of the arrow 39.

In use, a roll of adhesive tape 32 is mounted on the supply drum 31 and fed around the tensioning roller 33, the idle roller 34, through the guide rollers 35 and attach to the waste drum 36. The adhesive tape 32 is orientated so that the adhesive side of the tape 32 is directed upwards towards a lead frame clamp 40. When a lead frame 2 is mounted in the clamp 40 after molding, the masking tape 2 attached to the surface 5 of the lead frame is located above the adhesive tape 32 between the idle roller 34 and the guide rollers 35. The press roller 37 is then moved upwards to cause the adhesive tape 32 to contact the exposed side of the masking tape 2 and moved left and right in the direction of the arrow 39 to press the adhesive tape 32 onto the exposed side of the masking tape 2 so that the adhesive tape 32 adheres to the exposed side of the masking tape 2. The press roller 37 is then lowered away from the lead frame 1 and the adhesive tape removable mechanism 30 is moved in the direction of arrow 41 to peel the masking tape 2 away from the lead frame 1, as shown in FIG. 3B.

The masking tape 2 is peeled away from the lead frame 1 as the adhesive tape 32 is chosen such that the adhesion of the tape 32 to the exposed side of the masking tape 2 is greater than the adhesion of the masking tape 2 to the lead frame 1.

After adhesive tape 32 and masking tape 2 have been removed from the lead frame 1, the waste drum 36 is rotated by a drive mechanism (not shown) to wind the tape 32 onto the waste drum 36.

After the masking tape 2 has been removed from the lead frame 1, the waste drum 36 continues to be driven until a new section of adhesive tape 32 is located between the idle roller 34 and the guide rollers 35. The adhesive tape removal mechanism 30 then moved in a reverse direction to the arrow 41 to return it to its original position and the new section of adhesive tape 32 between the idle roller 34 and guide rollers 35 can be used to remove another masking tape 2 from another lead frame 1.

In addition, as shown in FIG. 3B, the air purge mechanism 10 described above, and shown in FIGS. 1A to 1C can also be used to aid detachment of the masking tape 2 from the lead frame 1. It should be noted that the air purge mechanism is used to aid detachment of the masking tape 2 after the adhesive tape 32 has been pressed on to the masking tape 2 by the press roller 37.

We claim:

1. Apparatus for detaching a film of material from a surface of a substrate, the apparatus comprising a holder adapted to hold a substrate but not a film attached thereto and the holder holding the substrate in a holding plane, an applicator movably mounted with respect to the holder, and the applicator moving the detachment member into contact with a film of material attached to a substrate held in the holder to apply the detachment member to the film, a fluid delivery device comprising an outlet adapted to be engaged with an aperture in the substrate to deliver fluid through the aperture to generate a detaching force between the film of material and the substrate and means for moving the detachment member away from the holding plane to remove the detachment member and the film from a substrate held in the holder.

2. Apparatus according to claim 1, further comprising a receiving mechanism to receive the detachment member and film removed from the substrate.

3. Apparatus according to claim 2, wherein the receiving mechanism comprises a drum onto which the removed detachment member and film is wound.

4. Apparatus according to claim 2, wherein the detachment member is continuous between the supply mechanism and the receiving mechanism.

5. Apparatus according to claim 1, wherein the fluid delivery device is adapted to be coupled to a pressurised fluid source, and the fluid delivery device being movably mounted with respect to the holder between an engaged position, in which the outlet engages with an aperture in a substrate held in the holder in use, and a disengaged position in which the outlet is disengaged from an aperture in a substrate mounted in the holder in use.

6. Apparatus according to claim 5, wherein the fluid delivery device further comprises sealing means to seal the outlet to the aperture when the fluid delivery device is in the engaged position.

7. Apparatus according to claim 5, wherein the outlet is adapted to be inserted through the aperture.

* * * * *